(12) United States Patent
Kasa et al.

(10) Patent No.: US 10,908,231 B2
(45) Date of Patent: Feb. 2, 2021

(54) SMALL BORE MAGNETIC MEASUREMENT SYSTEM, METHOD FOR MEASURING SMALL BORE MAGNETS

(71) Applicant: UCHICAGO ARGONNE, LLC, Chicago, IL (US)

(72) Inventors: Matthew T. Kasa, New Lenox, IL (US); Yury Ivanyushenkov, Darien, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 90 days.

(21) Appl. No.: 16/406,738

(22) Filed: May 8, 2019

(65) Prior Publication Data
US 2020/0355757 A1   Nov. 12, 2020

(51) Int. Cl.
| | | |
|---|---|---|
| *G01R 33/07* | (2006.01) | |
| *G01D 5/14* | (2006.01) | |
| *G01R 33/00* | (2006.01) | |
| *H01L 43/06* | (2006.01) | |

(52) U.S. Cl.
CPC .......... *G01R 33/072* (2013.01); *G01D 5/145* (2013.01); *G01R 33/0082* (2013.01); *H01L 43/06* (2013.01)

(58) Field of Classification Search
CPC .............. A61N 2005/1087; A61N 5/10; A61N 5/1077; G01R 33/0082; G01R 33/072; G01D 5/145
See application file for complete search history.

(56) References Cited

U.S. PATENT DOCUMENTS

| | | | | |
|---|---|---|---|---|
| 4,311,046 | A * | 1/1982 | Pittman | G01P 15/09 73/178 R |
| 7,019,522 | B1 * | 3/2006 | Johnson | G01R 33/025 324/260 |
| 9,649,510 | B2 * | 5/2017 | Balakin | A61N 5/107 |
| 2015/0056366 | A1 * | 2/2015 | Kariya | H01J 37/3171 427/8 |
| 2015/0273240 | A1 * | 10/2015 | Balakin | A61N 5/1081 250/396 ML |
| 2018/0133515 | A1 * | 5/2018 | Spotts | A61N 5/1077 |
| 2018/0269053 | A1 * | 9/2018 | Jaeschke | H01J 49/0009 |

FOREIGN PATENT DOCUMENTS

WO   WO2016124269   8/2016

* cited by examiner

*Primary Examiner* — Steven L Yeninas
(74) *Attorney, Agent, or Firm* — Cherskov Flaynik & Gurda, LLC

(57) ABSTRACT

The invention provides a system for measuring magnets, the system comprising a guide tube removably received by a beam chamber tunnel, wherein said guide tube has a first end terminating at a first end of the tunnel and a second end terminating at a second end of the tunnel; a flexible substrate removably and slidably received by the tube, wherein the flexible substrate has a first end and a second end; a first rotary stage removably attached to the first end of said flexible substrate and a second rotary stage removably attached to the second end of said flexible substrate wherein the first rotary stage and the second rotary stage effects movement of the substrate through the tube; and a Hall probe supported by the flexible substrate. Also provided is a method for measuring magnetic fields, the method comprising extending a measuring probe into a magnetic core while maintaining the probe at ambient temperature and pressure.

20 Claims, 9 Drawing Sheets

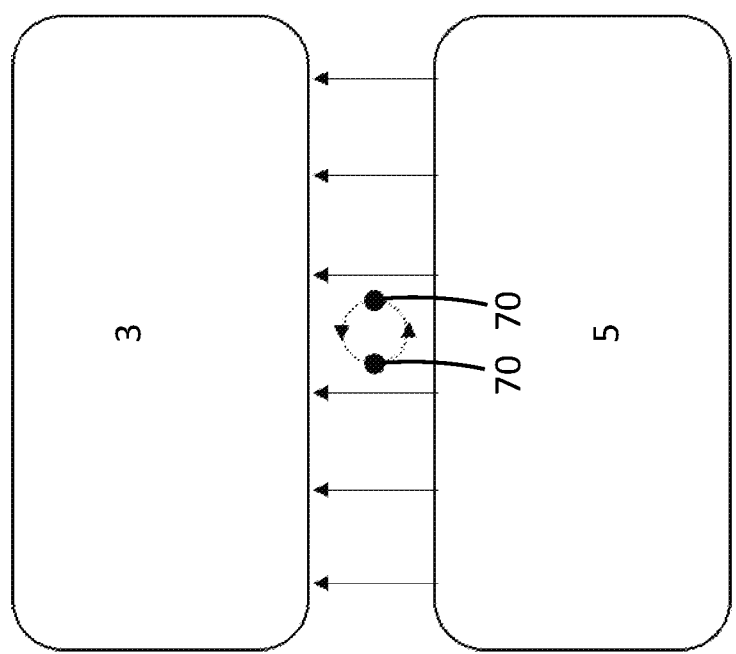

SMALL BORE MAGNETIC MEASUREMENT SYSTEM, METHOD FOR MEASURING SMALL BORE MAGNETS

CONTRACTUAL ORIGIN OF THE INVENTION

This invention was made with government support under Contract No. DE-AC02-06CH11357 awarded by the United States Department of Energy to UChicago Argonne, LLC, operator of Argonne National Laboratory. The government has certain rights in the invention.

BACKGROUND OF THE INVENTION

1. Field of the Invention

This invention relates to a magnetic measurement system and more specifically, this invention relates to a system and method for performing under normal operating conditions magnetic field measurements of small bore particle accelerator magnets and insertion devices for synchrotron light sources and free electron lasers.

2. Background of the Invention

Undulators and wigglers are used to generate intensive (e.g., coherent) beams of photons in synchrotron light sources and free electron lasers. These beams are used by scientists and engineers to perform experiments in physics, material science, biology, chemistry and other areas of science. For example, a beam line may be incorporated into a lithographic apparatus to apply a desired pattern onto a substrate. The wavelength of radiation determines the minimum size of features formed on that substrate.

Quality of radiation emitted by undulators and wigglers (known as insertion devices inasmuch as they are inserted into accelerator structures in synchrotron light sources) depends on the quality of the magnetic field achieved in those devices. So, it is desirable to measure the magnetic field of insertion devices with high precision.

A source of a radiation beam for lithography is a free electron laser. Output power of a free electron laser is dependent on the periodic magnetic field produced by an undulator, which may vary over time. So, it is desirable to periodically monitor the periodic magnetic field within an undulator of a free electron laser.

Existing magnetic measurement systems for insertion devices can be divided into two groups—for the devices with easy access to magnetic gap, and for devices with a magnetic structure located inside a vacuum vessel or a cryostat. A system of the former type usually utilizes a magnetic bench which is positioned aside an insertion device under measurement. Such a bench includes a massive granite block which holds a high-precision mechanical stage which moves a magnetic sensor inside the magnetic gap of the device under measurements. The size and weight of such a bench makes it impossible to be easily movable, and therefore it is used stationary in a magnetic measurement facility. This poses a requirement that an insertion device to be measured, must be moved in and out such a facility.

A system of the latter type usually utilizes a simplified magnetic bench which is positioned inside a vacuum vessel or a cryostat and becomes an integral part of the insertion device.

Another approach to measure a device which is embedded into a cryostat is to measure a magnetic structure in a dedicated measurement cryostat and then assemble it into a final cryostat.

A need exists in the art for a system that can be easily relocated and installed around an insertion device. The system should be capable of measuring many different types of insertion devices. The system should also be external to an insertion device so as not to require opening of a vacuum vessel or a cryostat for extraction. The system should perform magnetic measurements after assembly of the magnetic structure into the final cryostat so as to eliminate the need for an additional measurement cryostat.

SUMMARY OF INVENTION

An object of the invention is to provide a system and method for measuring small bore magnets that overcomes many of the drawbacks of the prior art.

Another object of the invention is to provide a system and method for performing magnetic measurements of magnets (e.g. super-conducting undulator, SCU, magnets). A feature of the invention is that an encoder scale is moved past the read-head compared to the conventional approach of fixing the encoder scale and moving the read-head. An advantage of the invention is that it can be used to characterize small bore magnetic systems, or permanent magnet configurations, the latter of which do not rely on cryogenic temperatures.

Still another object of the invention is to provide a portable system and method for measuring magnetic fields. A feature of the invention is that it can be easily relocated and installed around an insertion device. An advantage of the invention is that it eliminates a requirement that an insertion device can only be measured in a magnetic measurement facility.

Yet another object of the present invention is to provide a compact system for characterizing fields generated by small bore magnets. A feature of the device is the use of a flexible substrate for supporting magnetic sensors and other measuring devices. An advantage of the device is the elimination of rigid, multi-meter length linear stages heretofore used to support long-length holders, for instance carbon tubes containing the sensors and other measuring devices. Another advantage is the elimination of interferometry equipment typically required to measure the position of magnetic sensors inside a magnet core.

Another object of the present invention is to provide a system and method for characterizing small bore magnets that are embedded or otherwise positioned within vacuum vessels or cryostats. A feature of the invention is that all measurement components are maintained at room temperature and atmospheric pressure, which is to say ambient temperature and pressure. An advantage of the invention is that the measurements can be made when the small bore magnet is already assembled and sequestered within an operating cryostat.

Briefly, the invention provides a system for measuring magnets, the system comprising a guide tube removably received by a beam chamber tunnel, wherein said guide tube has a first end terminating at a first end of the tunnel and a second end terminating at a second end of the tunnel; a flexible substrate removably and slidably received by the tube, wherein the flexible substrate has a first end and a second end; a first rotary stage removably attached to the first end of said flexible substrate and a second rotary stage removably attached to the second end of said flexible substrate wherein the first rotary stage and the second rotary stage effects movement of the substrate through the tube; and a Hall probe supported by the flexible substrate.

The invention also provides a method for measuring magnetic fields, the method comprising extending a measuring probe into a magnetic core while maintaining the probe at ambient temperature and pressure.

BRIEF DESCRIPTION OF DRAWING

The invention together with the above and other objects and advantages will be best understood from the following detailed description of the preferred embodiment of the invention shown in the accompanying drawings, wherein:

FIG. 9 is a schematic view of a coil-based measurement system, in accordance with features of the present invention.

DETAILED DESCRIPTION OF THE INVENTION

Figure 1:
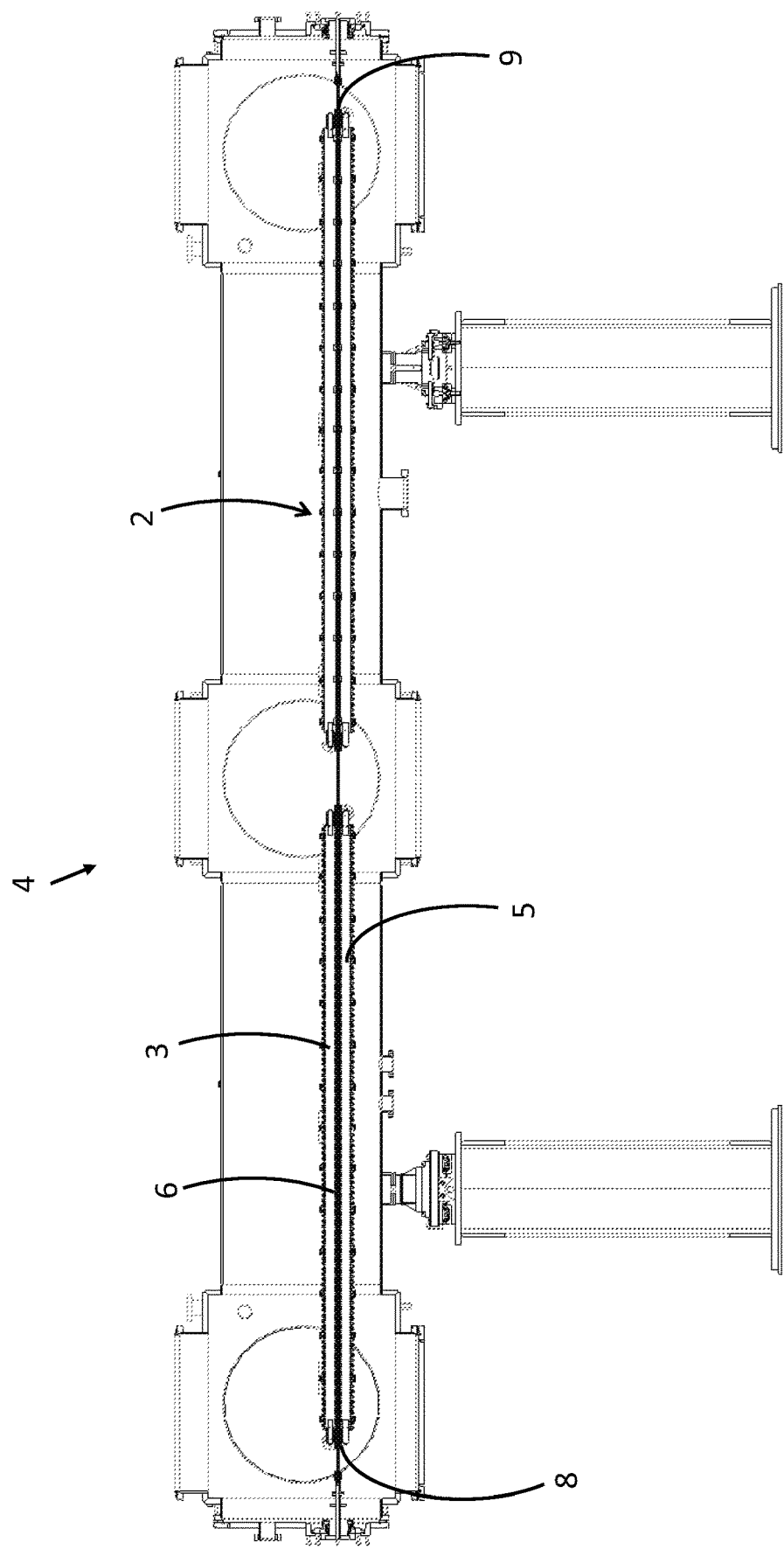
FIG. 1 is a schematic elevational view of portions of an in situ magnet measuring system for use in beam lines, in accordance with features of the present invention.

The foregoing summary, as well as the following detailed description of certain embodiments of the present invention, will be better understood when read in conjunction with the appended drawings.

All numeric values are herein assumed to be modified by the term "about", whether or not explicitly indicated. The term "about" generally refers to a range of numbers that one of skill in the art would consider equivalent to the recited value (e.g., having the same function or result). In many instances, the terms "about" may include numbers that are rounded to the nearest significant figure.

The recitation of numerical ranges by endpoints includes all numbers within that range (e.g. 1 to 5 includes 1, 1.5, 2, 2.75, 3, 3.80, 4, and 5).

The following detailed description should be read with reference to the drawings in which similar elements in different drawings are numbered the same. The drawings, which are not necessarily to scale, depict illustrative embodiments and are not intended to limit the scope of the invention.

As used herein, an element or step recited in the singular and preceded with the word "a" or "an" should be understood as not excluding plural said elements or steps, unless such exclusion is explicitly stated. As used in this specification and the appended claims, the term "or" is generally employed in its sense including "and/or" unless the content clearly dictates otherwise.

Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

The invention provides a method and system for measuring and otherwise characterizing magnetic fields in magnetic gaps. The invention defines a new technique of measuring the magnetic performance of a device inserted into the gaps. As stated supra, the invention is applicable to both small bore magnetic systems and permanent magnet systems. The size of the bores can range from 0.5 cm to 100 cm, preferably from 0.8 cm to 10 cm, and most preferably from 1 cm to 5 cm.

The basic measurement system requirements include the ability to magnetically characterize a planar SCU and associated corrector magnets. Planar refers to the configuration of the magnets depicted in the attached figures where there is a top and bottom core that extend in a straight line. However, the system can be easily adapted to other insertion device configurations (i.e. helical or elliptical style, or other magnet styles like multipole magnets) where the magnetic field region might be circular or elliptical.

Inasmuch as the invention is designed to work within the beam chamber aperture, it operates under cryostat normal operating conditions, wherein the magnets are maintained at 0-10 degrees Kelvin (K).

The invention enables field scans using a Hall Effect sensor, wherein the sensor is supported by the flexible encoded substrate. (A Hall Effect sensor is a magnetic field sensor that passes electrical current when the sensor is perpendicular to a magnetic field.) The field scans occur on-axis and off-axis in the horizontal plane (i.e., the x-axis). The system and sensor samples (and otherwise characterizes) the field in discrete locations. Approximately 0.2 mm increments in the beam direction (i.e., the z axis) are suitable.

FIG. 1 shows portions of the invented system. Generally, a plurality of magnets 2 are housed within a cryostat 4. A first longitudinally extending configuration of magnets 3 is positioned parallel to and above a second longitudinally extending configuration of magnets 5. These to configurations of magnets define a longitudinally extending magnetic gap defining a tunnel 6 opened at both a first end 8 and a second end 9. This tunnel 6 is adapted to receive charged particles so as to coherently form the particles into a beam upon imposition of a magnetic field imparted by the plurality 2 of magnets.

Figure 2:
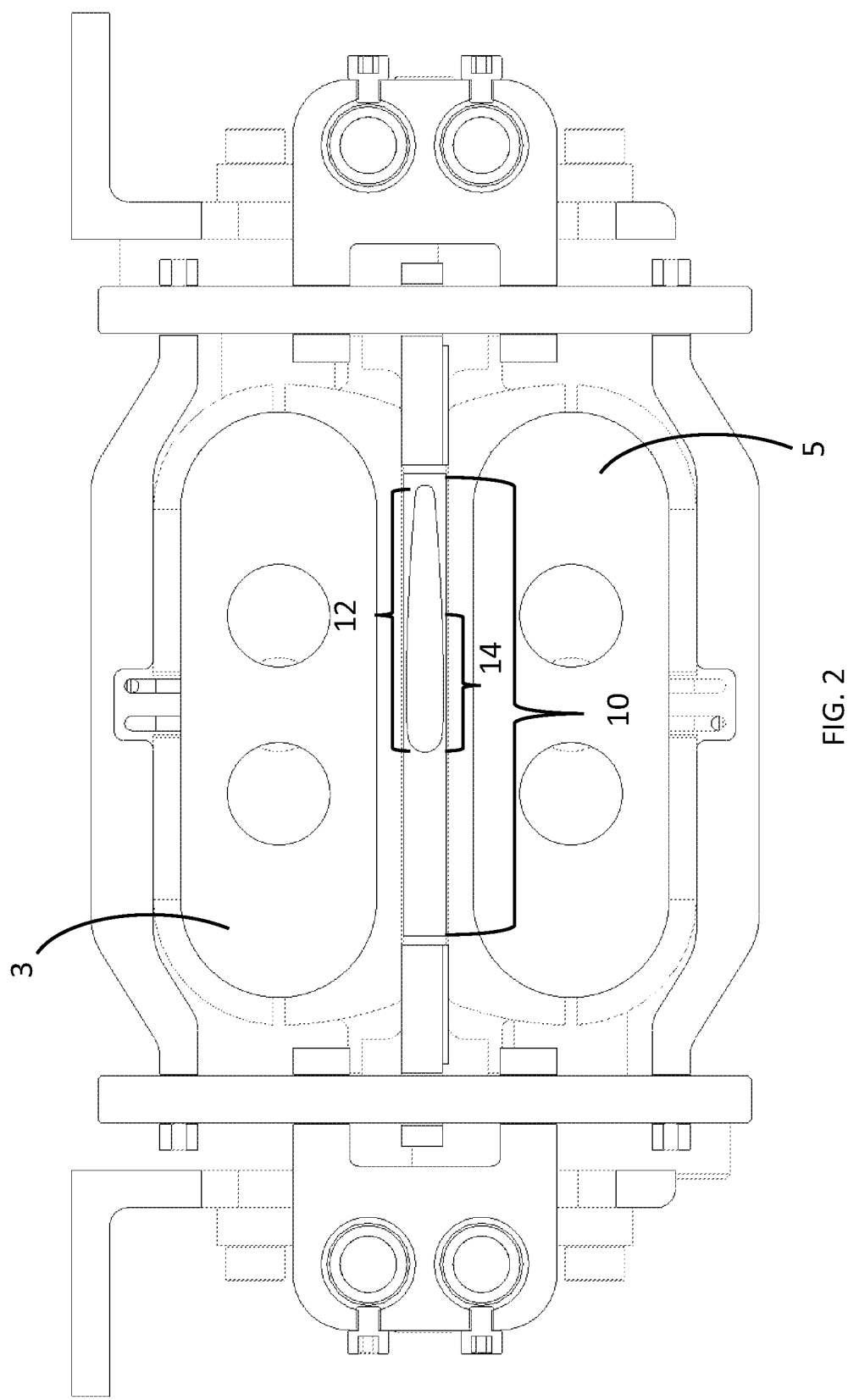
FIG. 2 is an end view of a magnetic core, in accordance with features of the present invention.
Figure 3:
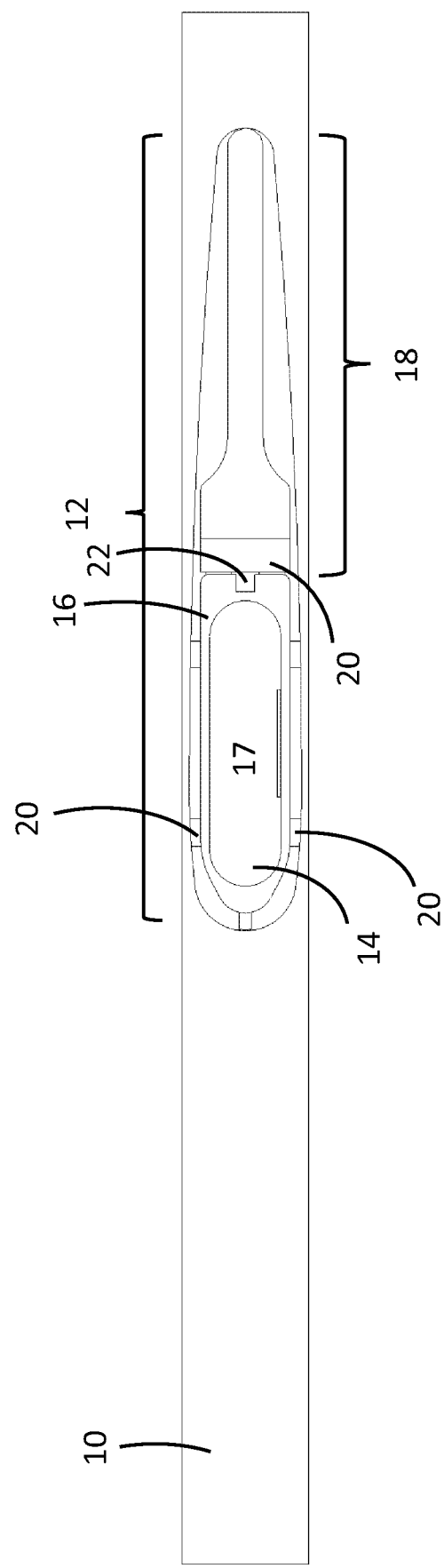
FIG. 3 is a schematic view of a machined guide tube, in accordance with features of the present invention.

As depicted in FIG. 2, nested within the tunnel is a beam chamber substrate 10. The beam chamber substrate 10 may extend the length of the tunnel contacted by the magnetic field. The substrate 10 defines a beam chamber aperture 12 which may be symmetrical, or asymmetrical as shown in FIGS. 2 and 3. The outside, lateral width of the beam chamber substrate 10 may be similar to the width of the beam tunnel 6. This close tolerance will allow for slidable yet snug interaction between the beam chamber substrate 10 and the tunnel 6.

The beam chamber substrate 10 defines the longitudinally-extending beam chamber aperture 12 which may have a symmetrical and/or asymmetrical cross section. The beam chamber aperture 12 is shown in FIG. 2 with an asymmetrical cross section. As more clearly shown in FIG. 3, a portion of the beam chamber aperture 12 defines a symmetrical aperture region 14. This symmetrical region is adapted to slidably receive a guide tube 16

A salient feature of the invention is the guide tube 16, more clearly depicted in FIG. 3. The symmetrical aperture region 14 is defined by the accelerator requirements and is part of the insertion device. The guide tube 16 is slidably received by the symmetrical aperture region 14. In essence, the guide tube 16 is positioned within the beam tunnel 6 and between the two pluralities of magnets (in the case of a planar insertion device) so as to be coaxial with the longitudinal axis of the two magnet plurality construct. Each plurality of magnets is shown comprising alternating wire coils and electrically conductive coil separators.

An asymmetrical region 18 of the beam chamber 10 is provided as a raceway for vacuum, electrical and structural utilities. For example, a plurality of standoffs 20 are provided to maintain the guide tube 16 securely within the symmetrical region 14 of the beam chamber 10. These standoffs 20 are selected to be comprised of thermally nonconductive material so as to maintain thermal insulation of the guide tube 16 (and particularly the aperture of the guide tube) from the rest of the assembly. The guide tube itself may further be comprised of thermally insulating material, such as low thermally conductive plastics (e.g., polyether ether ketone or other thermoplastic polymers, and injection molding grade resins such as Torlon®), low thermal conductive metal (e.g., titanium, stainless steel) and combinations (e.g., composites) thereof. Alternatively, the guide tube may be thermally conductive so as to be readily heated by electric coils or other heating means contacting the exterior surfaces of the guide tube. Either of these thermally insulative or conductive features will allow the interior voioide defined by the guide tube to be maintained at a first temperature (e.g., ambient or room temperature) while the magnetic core 2 is maintained at a second, lower temperature by the cryostat.

The standoffs also provide a void space in which a near vacuum condition may be maintained, to further aid in minimizing thermal conductance between the guide tube 16 and adjacent structures. In operation, the guide 16 tube may be maintained at room temperature (e.g., 300K) while the beam chamber 10 is maintained at 40 K.

A region of the guide tube 16 proximal to the asymmetrical region 18 may define a longitudinally extending channel 22 adapted to receive heater wires or other thermally conducting means to impart heat to the guide tube 16.

Figure 4:
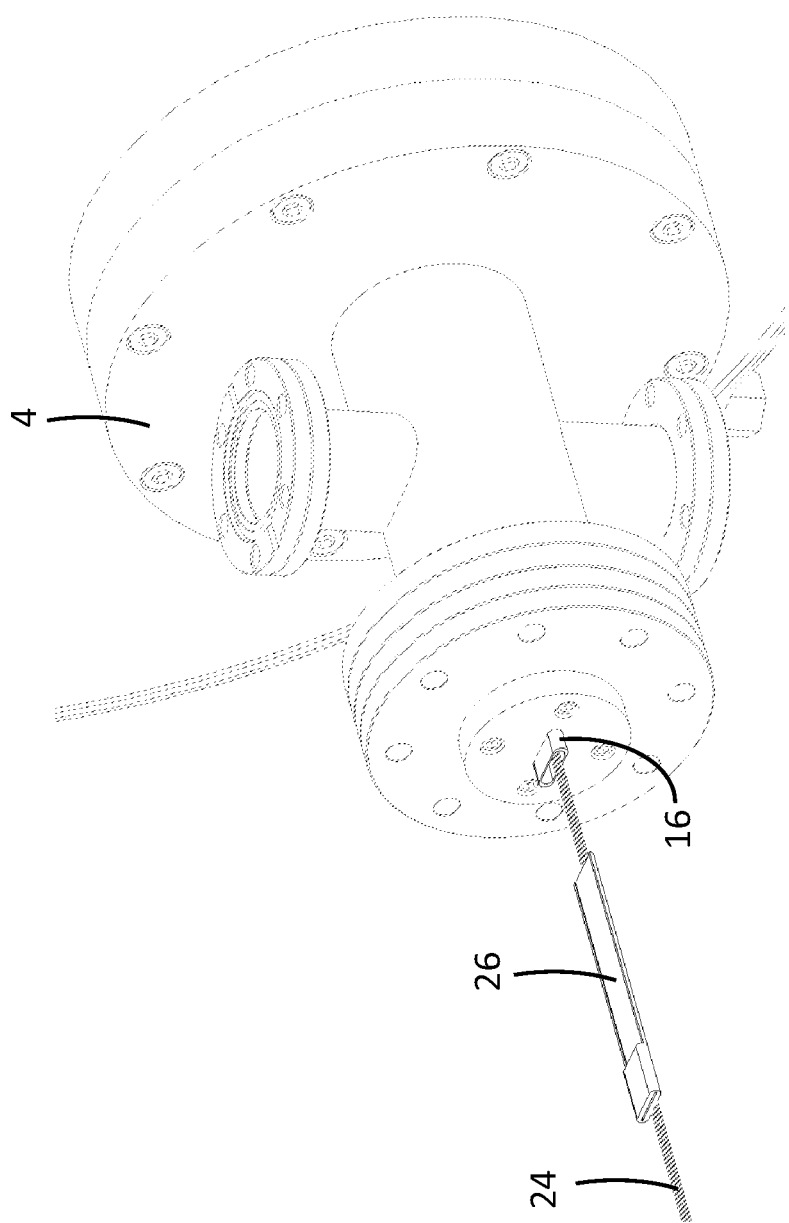
FIG. 4 is a perspective view of a linear encoder scale and probe, in accordance with features of the present invention.

The guide tube 16 provides a raceway 17 for a flexible substrate such as a tape adapted to support magnetic measuring probes. FIG. 4 depicts such a tape 24 in slidable communication with the guide tube 16. The tape 24 may or may not physically contact the guide tube. The tape 24 is adapted to receive probes for measuring the electrical, magnetic and mechanical status of the magnet bore. It may or may not be imprinted with hash marks or other units of measure. A preferred tape defines a flexible linear encoder scale which can be used to locate the position of any probe (e.g., a Hall probe) transported and dwelling within the guide tube and magnetic field region of interest. The source of the trigger signal is the position data from the flexible scale.

The inventors typically record data every 200 microns, but other intervals are equally suitable. Data may be recorded at any micron interval point that would provide accurate characterization of the core. Suitable tapes 24 are available commercially, including the Veratus series encoder from Celera Motion (Bedford, Mass.). That encoder embodies a flexible scale 6 mm by 0.2 mm Inconel 625. Its resolution is 1 micron and is available in up to 20 meter lengths. Generally, the encoder is comprised of both the scale and read head, both supplied by Celera motion FIG. 4 shows the use of a Hall probe carriage which is a substrate 26 durable enough to carry a Hall probe through the system, for later retrieval and replacement. The scale may be readable by a human operator (i.e., visually) or an optical reader. The scale may contain digital indicia to be discerned by a read head aligned to the flexible scale. Any of the aforementioned or other type of read-heads are positioned outside of the bore, and preferably outside of the cryostat 4.

Figure 5:
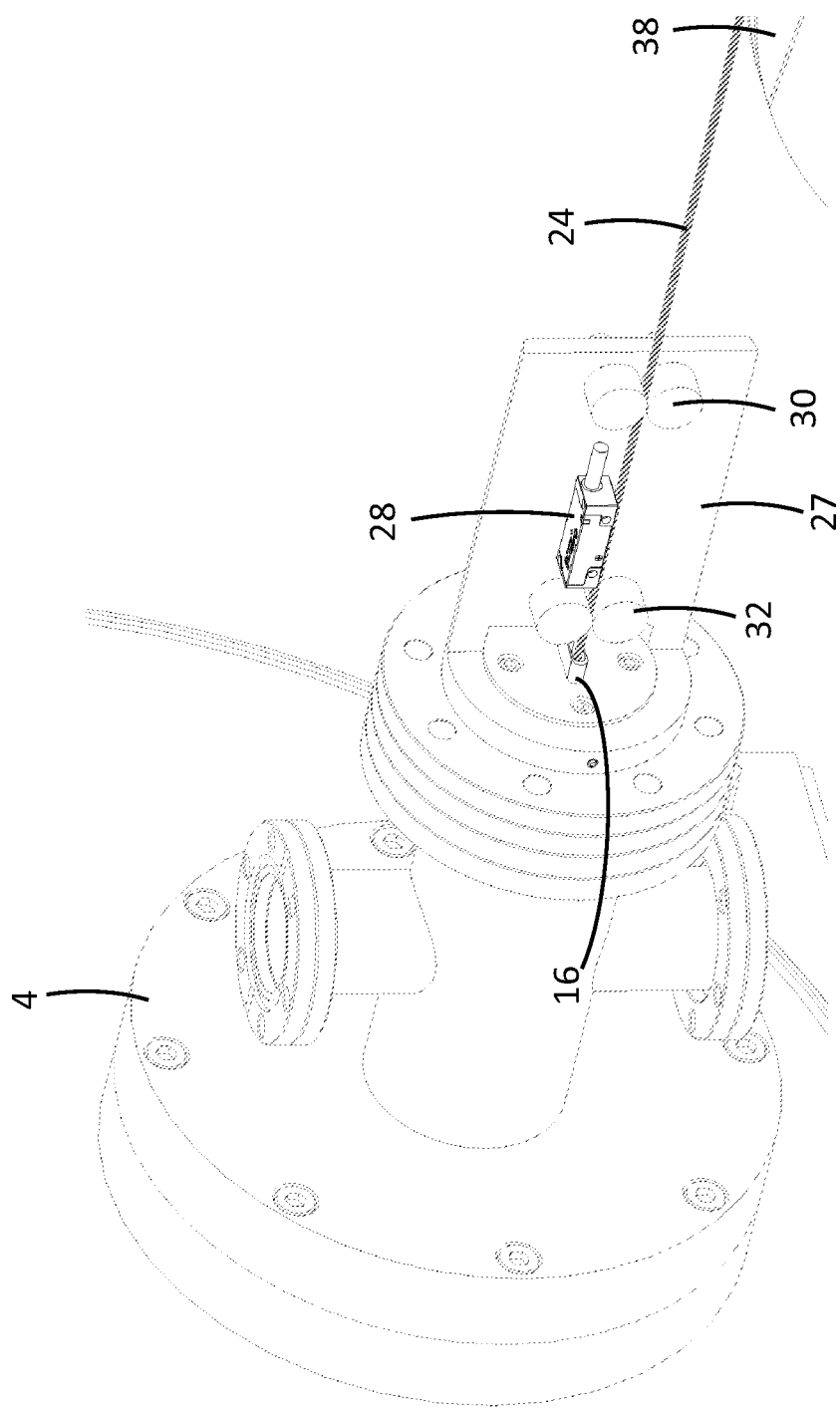
FIG. 5 is a perspective view of a linear encoding stage, in accordance with features of the present invention.

FIG. 5 depicts a linear stage assembly 27 to support the encoder read-head and scale alignment fixtures. Specifically, FIG. 5 shows an encoder read-head 28 positioned outside of the cryostat 4, in close spatial relationship and level to the guide tube 16. To assure alignment with the flexible linear encoder scale 24, the read-head 28 may be positioned between an upstream aligner or guide 30 and a downstream guide 32. The read-head 28, upstream guide 30 and downstream guide 32 may all be rigidly mounted to a backstop 34, itself mounted or otherwise fastened to exterior portions of the cryostat. These elements are shown as mounted to assure a generally straight path for the encoder scale 24 to traverse, thereby forming a linear stage assembly at each end of the cryostat.

Non-linear stage assemblies are also suitable. In instances where the scale is a closed loop system such that portions of the loop travel both through and outside the cryostat 4 (discussed infra), the elements 24, 30 and 32 may be configured to accommodate a curved taped feed into or out of the cryostat.

Figure 6:
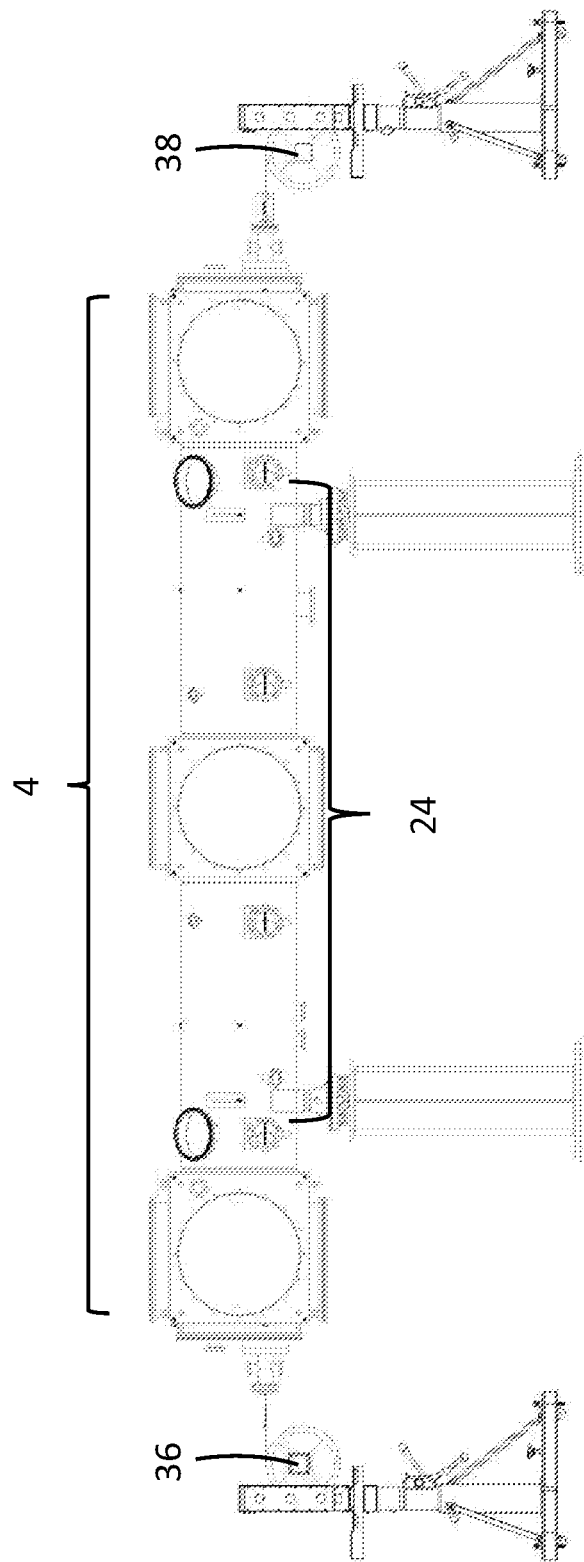
FIG. 6 is an elevational view of a cryostat flanked by encoder scale reels, in accordance with features of the present invention.

FIG. 6 shows the cryostat 4 flanked by a first take up reel 36 and a second take up reel 38. The reels are positioned to feed the linear encoder scale substrate 24 through the cryostat in a carriage-type arrangement, wherein the carriage is construed herein as probe carriage assembly. This reel/dereel configuration may drive a Hall probe carriage through the guide tube. The encoder scale 24 is moved past the encoder read-head 28 and coiled on the reels 36, 38 which are utilized for positioning of the tape and replicating the location of the trigger signal. The first real 36 may comprise a torque motor to maintain tension of the linear encoder scale substrate 24.

The second real 38 may comprise a servo motor which is controlled through feedback from the linear encoder read head 28. The feedback to the servo loop of the servo motor is the position read-back from the encoder read-head and scale. An objective is to know the position of the magnetic field sensor on the carriage as it is moved through the guide tube.

Figure 7:
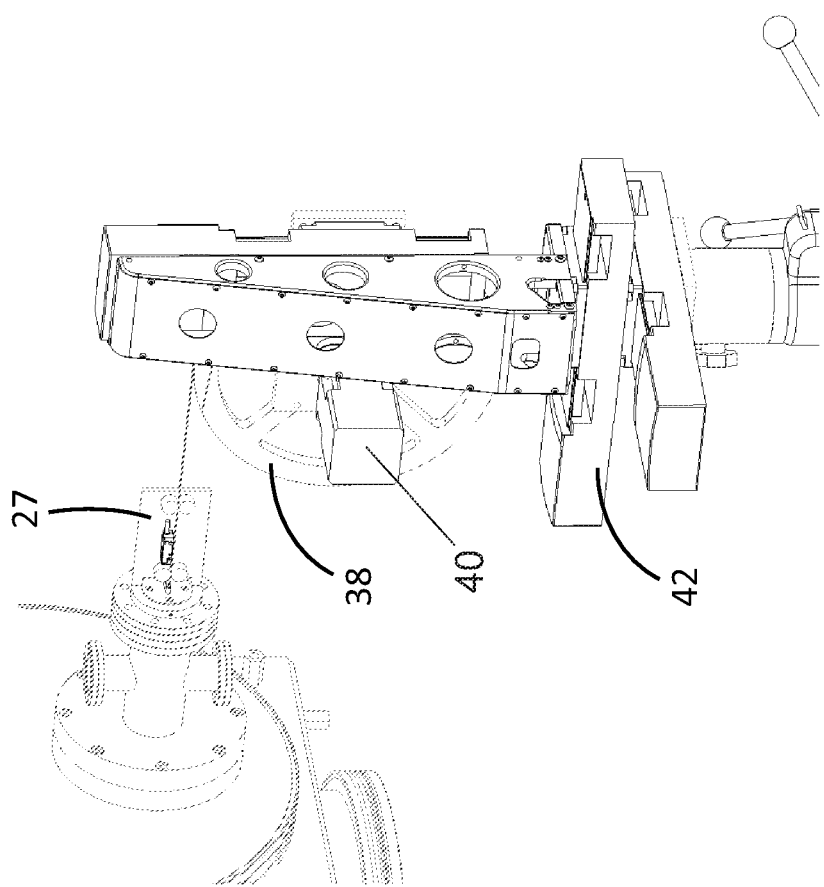
FIG. 7 is an isometric view of a servo motor, in accordance with features of the present invention.

FIG. 7 shows that the servo motor reel 38 may be positioned up stream or downstream of the linear stage assembly 27. Generally, the motor 40 is manipulated via an x-y-z stage 42. Stages with a 1 micron resolution and a 100 mm travel range in each axis direction are suitable. Such commercially available stages include the ILS100CC, manufactured by Newport Corporation (Milwaukee, Wis.).

In operation, the invention is applied to an already cryostatically sequestered magnetic core. The tension and servo reels are arranged at either end of the cryostat. The guide tube is inserted with in the beam so as to be generally coplanar to the beam line tunnel defined by the core. Then a linear encoder scale, supporting a Hall probe and/or other measurement modules, is slidably received by the guide tube. The offsets centering the guide tube within the beam line tunnel maintain the void defined by the guide tube at ambient temperature and pressure (e.g., room temperature and pressure). Measurements are taken of the magnetic field, for example every 200 microns, and the magnetic field is characterized, thusly. The 3-axis measurement module may have an orthogonality error of less than 0.1 degrees.

In summary, the invention provides a system for measuring magnets, the system comprising a guide tube removably received by a beam chamber tunnel, wherein said guide tube has a first end terminating at a first end of the tunnel and a second end terminating at a second end of the tunnel; a flexible substrate removably and slidably received by the tube, wherein the flexible substrate has a first end and a second end; a first rotary stage removably attached to the first end of said flexible substrate and a second rotary stage removably attached to the second end of said flexible substrate wherein the first rotary stage and the second rotary stage effects movement of the substrate through the tube; and a Hall probe supported by the flexible substrate.

The aforementioned flexible substrate defines a scale and further comprises a plurality of markings to be read by a linear encoder.

The aforementioned guide tube defines a longitudinally extending void and the void is maintained at ambient temperature and pressure. The guide tube is maintained at a temperature that is higher than the temperature of the beam chamber tunnel.

The first rotary stage comprises a torque motor and the second rotary stage comprises a servo motor, wherein the torque motor maintains tension to the flexible substrate and the servo motor is controlled by the linear encoder. The first stage could be a servo motor as well. Two servo motors could be tied together in a master/slave configuration to maintain the tension.

The beam chamber tunnel is housed in a cryostat. The flexible substrate simultaneously passes through the beam chamber tunnel and outside the cryostat. The guide tube may define a nonsymmetrical cross section. It is thermally conductive and is adapted to receive a means for heating. Also, it may be thermally insulated from the beam chamber tunnel.

The invented method for measuring magnetic fields may be summarized as extending a measuring probe into a cryogenically maintained magnetic core while maintaining the probe at ambient (e.g. room) temperature and pressure. For example, the magnetic core is maintained at temperatures between 0 degrees K and 300 K.

The measuring probe is supported by a flexible substrate, which may be a flexible encoder scale with a suitable resolution (for example between 20 nanometers micron and 100 microns. Resolutions available from scale manufacturers include 5 µm, 2.5 µm, 1 µm, 0.5 µm, 0.2 µm, 0.1 µm, 50 nm, 20 nm. Any of these resolutions are suitable.

The flexible substrate has a first end and a second end, wherein the first end is in communication with a torque motor take up reel and the second end is in communication with a servo motor take up reel. The servo motor is supported by a commercially available x,y,z stage. Such stages have a resolution similar to those discussed in the immediately preceding paragraph.

Figure 8:
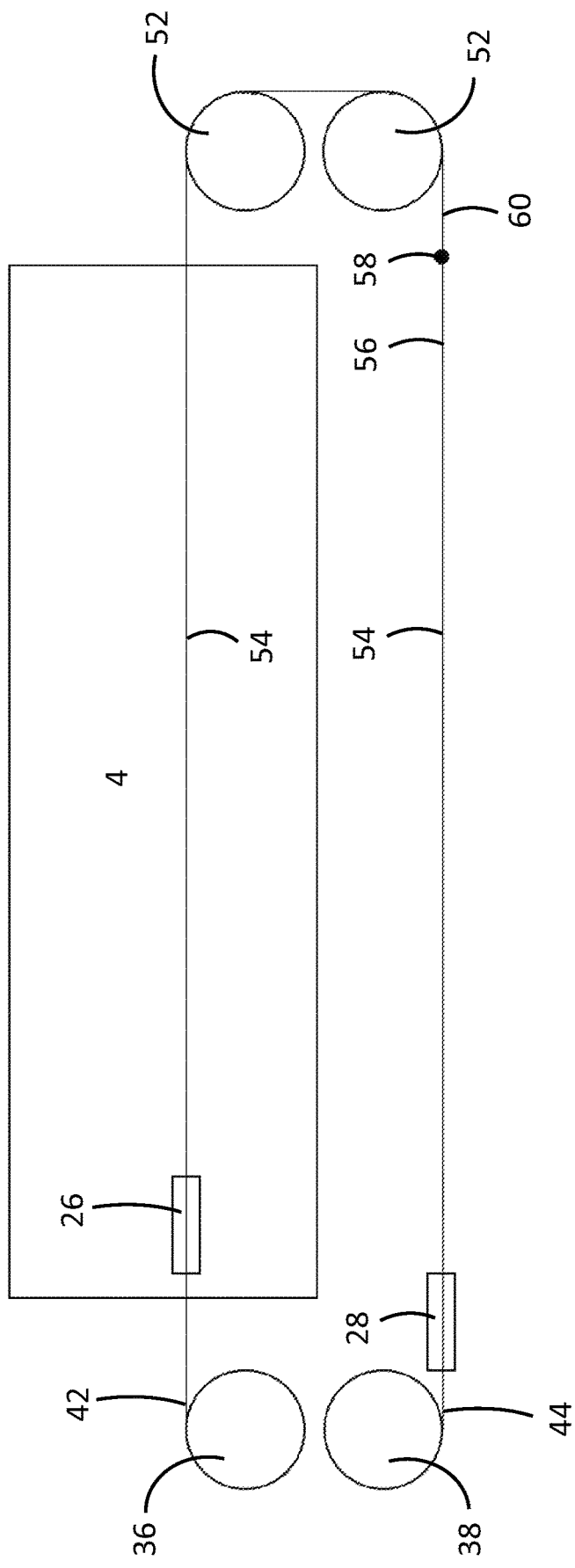
FIG. 8 is schematic view of a flexible loop scale configuration, in accordance with features of the present invention.

Conversely, the flexible substrate may be a loop such that part of the flexible substrate resides inside of the magnetic field while another part is traversing underneath the carriage and cryostat. FIG. 8 depicts such a configuration. As shown therein, the torque motor 36 and servo motor 38 may be positioned at the same end of the cryostat, thereby resulting in a more compact assembly overall. At the other end of the cryostat is positioned a plurality of freewheeling spools 52.

Unlike the configurations described supra, a graduated tape or scaled substrate does not traverse inside the cryostat. Rather, a hybrid tape 54 is utilized with a scaled substrate 56 remaining outside the cryostat at all times. The hybrid tape further defines a transition point 58 wherein the outside scale terminates and a take up cable or thread 60 replaces it. (The connection point of the scale to the take up cable may be affected via a variety of means, including a flexible link, mechanical crimping, pins, screws, and combinations thereof.) It is this cable or thread 60 that traverses the interior of the core. As such, the torque motor 36 is in physical contact with the cable or thread 60 while the servo motor 38 serves as the take up reel for the scaled substrate 56.

Inasmuch as the scale and the cable are continuous with each other, the location of the carriage supporting the probe (and actually traversing the core) is easily determined. Also, relegating the scale to the exterior of the cryostat affords a wider array of materials to constitute the scale, such that both magnetic and nonmagnetic constituents may be utilized. This may afford greater advantage to the type of read head assembly (also situated outside of the cryostat) which can be utilized.

The hybrid tape 54 of the inside-outside loop configuration depicted in FIG. 8 has a first end 42 in rotatable communication with the torque motor and a second end 44 in rotatable communication with the servo motor 38. However, other configurations include a continuous loop tape such that a first or second end is non-existent. This may obviate the need for a servo motor, thereby optimizing the compact nature of the invented system.

The invented system may also be utilized with a rotating coil. Rotating coils facilitate the measurement of longitudinally integrated field integrals, i.e., transverse dependence of vertical and horizontal $1^{st}$ and $2^{nd}$ field integrals. They are more accurate than Hall probes for determining field integrals. They are also important for the determination shimming of multipole errors.

FIG. 9 is a cross section schematic depiction of a rotating coil system. The rotating coil is an elongated loop of wire that is rotated or flipped at high speed in a magnetic field. The movement of the wire in the field induces a voltage which reverses as the coil flips. The voltage is higher when the wire is moving perpendicular to the field direction and zero when moving parallel. This technique is useful for measuring the integrated field, including fringe fields, as long as the coil is longer than the magnet. Preferably, the coil is stretched tight so as not to flex.

As with the flexible support tape 24 depicted in previous figures, the rotating coil 70 is flanked by a first longitudinally extending configuration of magnets 3 and a second longitudinally extending configuration of magnets 5. Upwardly extending arrows in FIG. 9 illustrate the magnetic field imparted by the two pluralities 2 of magnets. The curved arrows flanking the rotating coil 70 depict its rotation, which in this case is counterclockwise.

The coil length is longer than the magnet. This is similar to the flexible linear encoder scale 22 being longer than the core, inasmuch as the coil 70 is actuated from outside the core. For rotating coil measurements, the spools and both motors of aforedescribed embodiments are removed and replaced by rotary stages (not shown). The coil is then supported at the ends and rotated via the rotary stages. This arrangement is akin to a rubber band stretched betwixt two pairs of fingers, wherein the rubber band is the coil and the each of the pair is a rotary stage.

When a rotating coil is utilized, the system measures the first field integral on-axis and off-axis in the horizontal plane in discrete increments (e.g., 1 mm increments), wherein the first integral quantifies the exit angle of the electron beam. (A zero first integral indicates a straight beam parallel with the z axis.) The system also measures the second field integral on-axis, which determines the exit offset of the beam from the insertion device.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting, but are instead exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," "more than" and the like include the number recited and refer to ranges which can be subsequently broken down into subranges as discussed above. In the same manner, all ratios disclosed herein also include all subratios falling within the broader ratio.

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

The embodiment of the invention in which an exclusive property or privilege is claimed is defined as follows:

1. A system for measuring magnets, the system comprising:
    a) a guide tube removably received by a beam chamber tunnel, wherein said guide tube has a first end terminating at a first end of the tunnel and a second end terminating at a second end of the tunnel;
    b) a flexible substrate slidably received by the tube, wherein the flexible substrate has a first end and a second end;
    c) a first rotary stage removably attached to the first end of said flexible substrate and a second rotary stage removably attached to the second end of said flexible substrate wherein the first rotary stage and the second rotary stage effects movement of the substrate through the tube; and
    d) a Hall probe supported by the flexible substrate.

2. The system as recited in claim 1 wherein the flexible substrate defines a scale.

3. The system as recited in claim 1 wherein the flexible substrate comprises a plurality of markings to be read by an encoder read head.

4. The system as recited in claim 3 wherein the first rotary stage comprises a torque motor and the second rotary stage comprises a servo motor, wherein the torque motor maintains tension to the flexible substrate and the servo motor is controlled by the encoder read head.

5. The system as recited in claim 1 wherein the guide tube defines a longitudinally extending void and the void is maintained at ambient temperature and pressure.

6. The system as recited in claim 1 wherein the guide tube is maintained at a first temperature that is higher than a second temperature of the beam chamber tunnel.

7. The system as recited in claim 1 wherein the beam chamber tunnel is housed in a cryostat.

8. The system as recited in claim 7 wherein the flexible substrate simultaneously passes through the beam chamber tunnel and outside the cryostat.

9. The system as recited in claim 1 wherein the guide tube defines a nonsymmetrical cross section.

10. The system as recited in claim 1 wherein the guide tube is adapted to receive a means for heating.

11. The system as recited in claim 1 wherein the guide tube is thermally insulated from the beam chamber tunnel.

12. A method for measuring magnetic fields, the method comprising:
    a. removably inserting a guide tube into a magnetic core;
    b. extending a measuring probe, supported on a flexible substrate having a first end and a second end, into the tube while maintaining the probe at ambient temperature and pressure; and
    c. effecting movement of the substrate through the tube via a first rotary stage removably attached to the first end of said flexible substrate and a second rotary stage removably attached to the second end of said flexible substrate.

13. The method as recited in claim 12 wherein the magnetic core is maintained at temperatures between 0 K and 300 K.

14. The method as recited in claim 12 wherein the measuring probe is supported by a flexible substrate.

15. The method as recited in claim 12 wherein the measuring probe is supported by a flexible encoder scale.

16. The method as recited in claim 15 wherein the flexible encoder scale has a first end and a second end.

17. The method as recited in claim 16 wherein the first end is in rotatable communication with a torque motor take up reel and the second end is in rotatable communication with a servo motor take up reel.

18. The method as recited in claim 17 wherein the servo motor is supported by an x, y, z stage.

19. The method as recited in claim 18 wherein the stage and the flexible encoder scale each have a resolution of between 20 nanometers and 100 microns.

20. The method as recited in claim 12 wherein the magnetic core is enclosed in a cryostat.

* * * * *